(12) United States Patent
Lin et al.

(10) Patent No.: US 10,003,304 B2
(45) Date of Patent: Jun. 19, 2018

(54) OPERATIONAL AMPLIFIER AND METHOD FOR REDUCING OFFSET VOLTAGE OF OPERATIONAL AMPLIFIER

(71) Applicant: ANPEC ELECTRONICS CORPORATION, Hsinchu (TW)

(72) Inventors: Hsin-Tai Lin, Taichung (TW); Chih-Yuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days. days.

(21) Appl. No.: 15/473,217

(22) Filed: Mar. 29, 2017

(65) Prior Publication Data

US 2018/0131328 A1    May 10, 2018

(30) Foreign Application Priority Data

Nov. 4, 2016 (TW) .............................. 105135971 A

(51) Int. Cl.
*H03F 1/02* (2006.01)
*H03F 3/45* (2006.01)

(52) U.S. Cl.
CPC ....... *H03F 1/0222* (2013.01); *H03F 3/45183* (2013.01); *H03F 2203/45026* (2013.01); *H03F 2203/45212* (2013.01)

(58) Field of Classification Search
CPC ........... H03F 1/02; H03F 3/45183; H03F 1/20
See application file for complete search history.

(56) References Cited

U.S. PATENT DOCUMENTS

| 7,791,401 | B1 * | 9/2010 | Chiu | ........................ G05F 3/30 327/513 |
| 9,615,744 | B2 * | 4/2017 | Denison | ............... A61B 5/0002 |
| 9,787,263 | B2 * | 10/2017 | Patel | ................... H03F 3/45273 |
| 2003/0184459 | A1 * | 10/2003 | Engl | ..................... G11C 27/026 341/120 |
| 2007/0194847 | A1 * | 8/2007 | Machida | ............. H03F 3/45085 330/254 |
| 2012/0001892 | A1 * | 1/2012 | Kojima | ................. H03F 3/3022 345/212 |

* cited by examiner

*Primary Examiner* — Patricia T Nguyen
(74) *Attorney, Agent, or Firm* — Li & Cai Intellectual Property (USA) Office

(57) ABSTRACT

Disclosed are an operational amplifier and a method for reducing an offset voltage of the operational amplifier, which control an auxiliary circuit to generate a first auxiliary current and a second auxiliary current by adjusting the resistance of a resistance regulator, thereby adjusting a first current and a second current outputted from an input-stage circuit and further adjusting the offset voltage of the operational amplifier. Therefore, the operational amplifier and the method for reducing the offset voltage of the operational amplifier use the resistors to adjust the offset voltage so as to reduce the Least Significant Bit (LSB) distribution, thereby enhancing the accuracy of the offset voltage.

10 Claims, 8 Drawing Sheets

OPERATIONAL AMPLIFIER AND METHOD FOR REDUCING OFFSET VOLTAGE OF OPERATIONAL AMPLIFIER

BACKGROUND

1. Technical Field

The present disclosure relates to an operational amplifier and a method for reducing the offset voltage of the operational amplifier, in particular, to the operational amplifier and the method for reducing the offset voltage by adjusting a current value between an input stage circuit and an output stage circuit of the operational amplifier.

2. Description of Related Art

An ideal operational amplifier has the following characters: infinite input impedance, zero output impedance, infinite open loop gain, infinite common mode rejection ratio, and infinite frequency bandwidth. For conventional operational amplifiers, even if the operational amplifier is 0 volt, the output signal with 0 volt cannot be produced because of the limitations on semiconductor processes and integrated circuit techniques. In order to present properties of conventional operational amplifiers, an offset voltage is used for representing the non-ideal effects in the prior art.

FIG. 1 shows a diagram of a conventional operational amplifier 10. The operational amplifier 10 includes an input stage circuit 12, an output stage circuit 14, and an offset voltage Voff. The operational amplifier 10 receives differential signals from a positive input terminal Vin+ and a negative input terminal Vin−, and outputs the currents C1 and C2 to the output stage circuit 14. Then an output terminal Vout of the operational amplifier 10 outputs an amplified result. The offset voltage Voff represents non-ideal effects of the operational amplifier 10 (which does not exist in the actual circuit). The offset voltage Voff represents the voltage difference between the output terminal Vout and the positive input terminal Vin+ while the output terminal Vout is coupled to the negative input terminal Vin− (forming a unit gain feedback structure). There are many reasons that cause the generation of offset voltage, such as physical properties of semiconductors, process imperfections, component mismatches, etc.

The conventional operational amplifier 10 uses many transistors to adjust the offset voltage Voff. Reference is made to FIG. 2, which shows a diagram of the input stage circuit 12 of FIG. 1. The input stage circuit 12 has transistors Sa, Sb, auxiliary transistors Sa1, Sa2, Sa3, Sa4, Sb1, Sb2, Sb3, Sb4, switching elements Fa1, Fa2, Fa3, Fa4, Fb1, Fb2, Fb3, Fb4, and a current source Ia. The transistor Sa is coupled between the current source Ia and the output stage circuit 14. The transistor Sb is coupled between the current source Ia and the output stage circuit 14. The auxiliary transistors Sa1-Sa4 are coupled between the current source Ia and the output stage circuit 14 through the corresponding switching elements Fa1-Fa4. The transistor Sa is connected to the auxiliary transistors Sa1-Sa4 in parallel. The auxiliary transistors Sb1-Sb4 are coupled between the current source Ia and the output stage circuit 14 through the corresponding switching elements Fb1-Fb4. The transistor Sb is connected to the auxiliary transistors Sb1-Sb4 in parallel.

The positive input terminal Vin+ is electrically connected to the control terminal of the transistor Sa and the control terminal of the auxiliary transistors Sa1-Sa4. The negative input terminal Vin− is electrically connected to the control terminal of the transistor Sb and the control terminal of the auxiliary transistors Sb1-Sb4. The input stage circuit 12 generates the currents C1 and C2 to the output stage circuit 14 according to the voltage of the positive input terminal Vin+ and the voltage of the negative input terminal Vin−. The width length ratios (W/L) of the transistors Sa and of the auxiliary transistors Sa1-Sa4 are W/L, W/2L, W/4 L, W/8 L, and W/16 L. The width length ratios (W/L) of the transistors Sb and of the auxiliary transistors Sb1-Sb4 are W/L, W/2 L, W/4 L, W/8 L, and W/16 L. Therefore, user can adjust the voltage of the positive input terminal Vin+ and the voltage of the negative input terminal Vin− by turning on or turning off the switching elements Fa1-Fa4 and Fb1-Fb4, to adjust the currents C1 and C2 for offsetting the offset voltage Voff to be 0V.

However, each transistor has its own size and the physical characteristics are not scaled. Conventional operational amplifiers using the transistors to adjust the offset voltage would cause the higher least significant bit (LSB) distribution, so the error occurred in adjusting the offset voltage Voff becomes higher, resulting in the adjustment accuracy for the offset voltage Voff to be lowered. Therefore, how to enhance the accuracy of the offset voltage has become one of the important tasks in the industry.

SUMMARY

Accordingly, exemplary embodiments of the present disclosure provide an operational amplifier and a method for reducing the offset voltage of the operational amplifier, which use resistors to adjust the offset voltage so as to reduce the Least Significant Bit (LSB) distribution, thereby enhancing the accuracy of the offset voltage.

An exemplary embodiment of the present disclosure provides an operational amplifier. The operational amplifier comprises an input stage circuit, a current adjusting circuit, and an output stage circuit. The input stage circuit has a positive input terminal, a negative input terminal, a first terminal, and a second terminal. The input stage circuit respectively outputs a first current and a second current to the first terminal and the second terminal according to a voltage received from the positive input terminal and a voltage received from the negative input terminal. The current adjusting circuit includes an auxiliary circuit and two resistance regulators. The auxiliary circuit is coupled to the first terminal and the second terminal, and has a positive auxiliary terminal and a negative auxiliary terminal. The two resistance regulators are respectively coupled to an auxiliary current source through the positive auxiliary terminal and the negative auxiliary terminal. The two resistance regulators adjust a voltage of the positive auxiliary terminal and a voltage of the negative auxiliary terminal according to the first current and the second current, to control the auxiliary circuit transmitting a first auxiliary current and a second auxiliary current to the first terminal and the second terminal respectively. The voltage of the positive auxiliary terminal and the voltage of the negative auxiliary terminal are adjusted by a current value of the auxiliary current source and a resistance value of the corresponding resistance regulator. The output stage circuit is coupled to the first terminal and the second terminal. The output stage circuit receives the first current and the first auxiliary current from the first terminal as an adjusted first current. The output stage circuit receives the second current and the second auxiliary current from the second terminal as an adjusted second current. The output stage circuit outputs an output voltage according to the adjusted first current and the adjusted second current.

Another exemplary embodiment of the present disclosure provides a method for reducing an offset voltage of an operational amplifier. The operational amplifier has an input stage circuit, a current adjusting circuit, and an output stage circuit. The current adjusting circuit has an auxiliary circuit and two resistance regulators. The input stage circuit is coupled to the output stage circuit and the auxiliary circuit by a first terminal and a second terminal. The two resistance regulators are respectively coupled to an auxiliary current source by a positive auxiliary terminal and a negative auxiliary terminal of the auxiliary circuit. The method comprises the following steps: Step 1: respectively outputting a first current and a second current to the first terminal and the second terminal according to a voltage received from a positive input terminal and a voltage received from a negative input terminal of the input stage circuit, Step 2: in the two resistance regulators, adjusting a voltage of the positive auxiliary terminal and a voltage of the negative auxiliary terminal according to the first current and the second current, to control the auxiliary circuit transmitting a first auxiliary current and a second auxiliary current to the first terminal and the second terminal respectively, wherein the voltage of the positive auxiliary terminal and the voltage of the negative auxiliary terminal are adjusted by a current value of the auxiliary current source and a resistance value of the corresponding resistance regulator, and Step 3: in the output stage circuit, receiving the first current and the first auxiliary current from the first terminal as an adjusted first current, receiving the second current and the second auxiliary current from the second terminal as an adjusted second current, and outputting an output voltage according to the adjusted first current and the adjusted second current.

To sum up, the present disclosure provides an operational amplifier and a method for reducing an offset voltage of the operational amplifier, which control an auxiliary circuit to generate a first auxiliary current and a second auxiliary current by adjusting the resistance of a resistance regulator, thereby adjusting a first current and a second current outputted from an input-stage circuit and further adjusting the offset voltage of the operational amplifier. As the operational amplifier and the method for reducing the offset voltage of the operational amplifier use the resistors to adjust the offset voltage and the matching degree of the resistance is higher than that of the transistor, the Least Significant Bit (LSB) distribution can be reduced, thereby enhancing the accuracy of the offset voltage.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
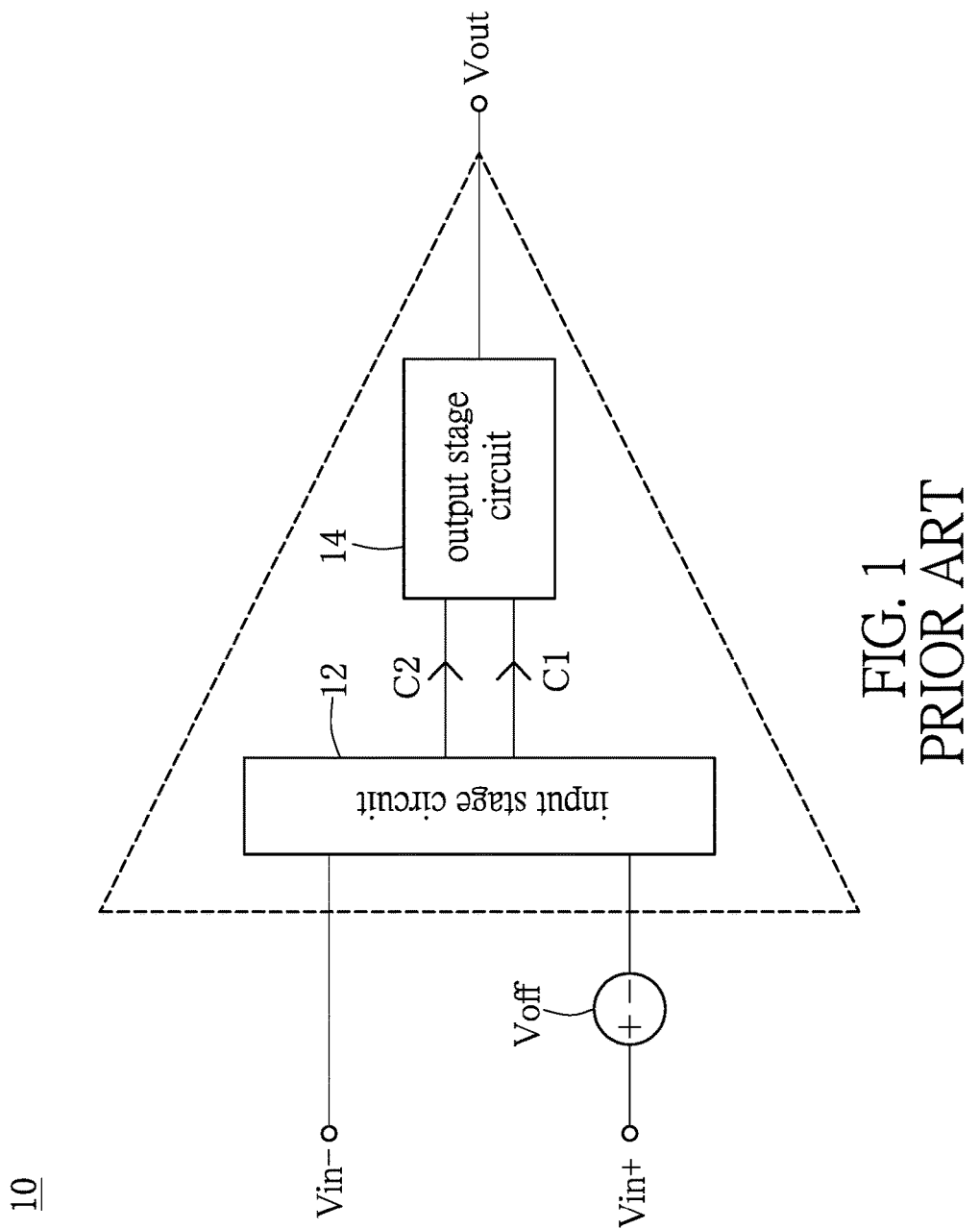
FIG. 1 shows the diagram of a traditional operational amplifier.
Figure 2:
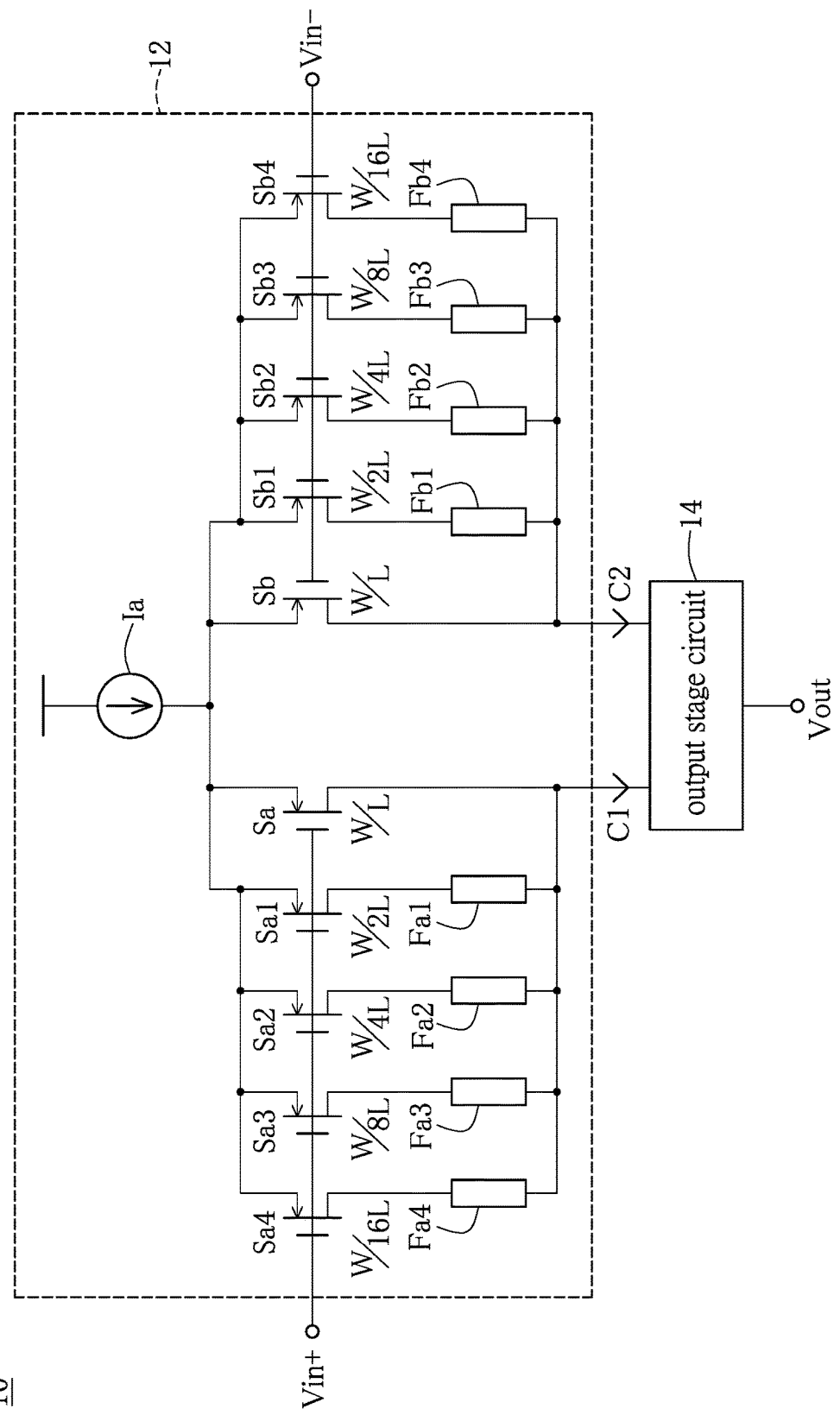
FIG. 2 shows the diagram of an input stage circuit of FIG. 1.

Reference will now be made in detail to the exemplary embodiments of the present disclosure, examples of which are illustrated in the accompanying drawings. Wherever possible, the same reference numbers are used in the drawings and the description to refer to the same or like parts.

Figure 3:
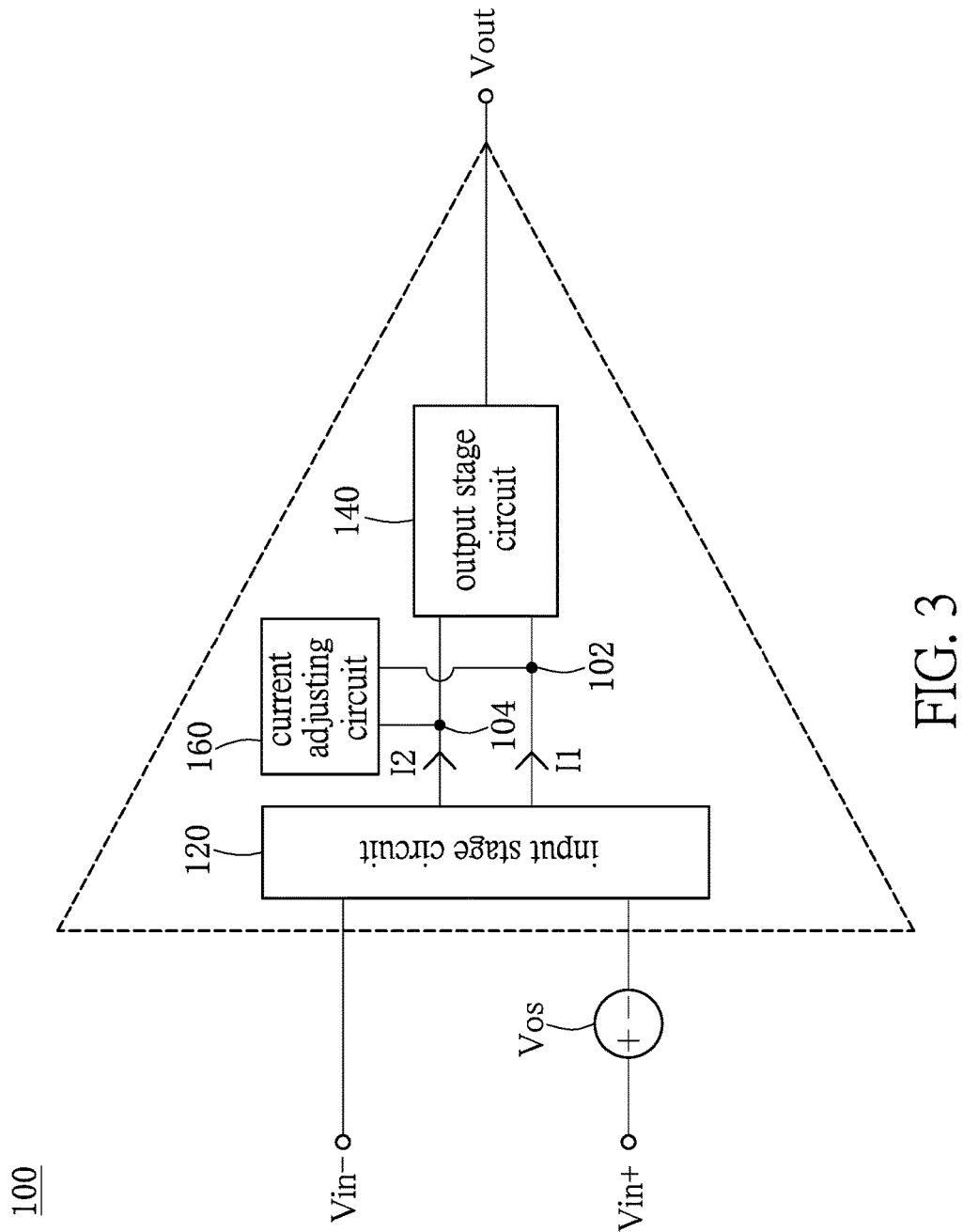
FIG. 3 shows the diagram of an operational amplifier according to an embodiment of the present disclosure.
Figure 4:
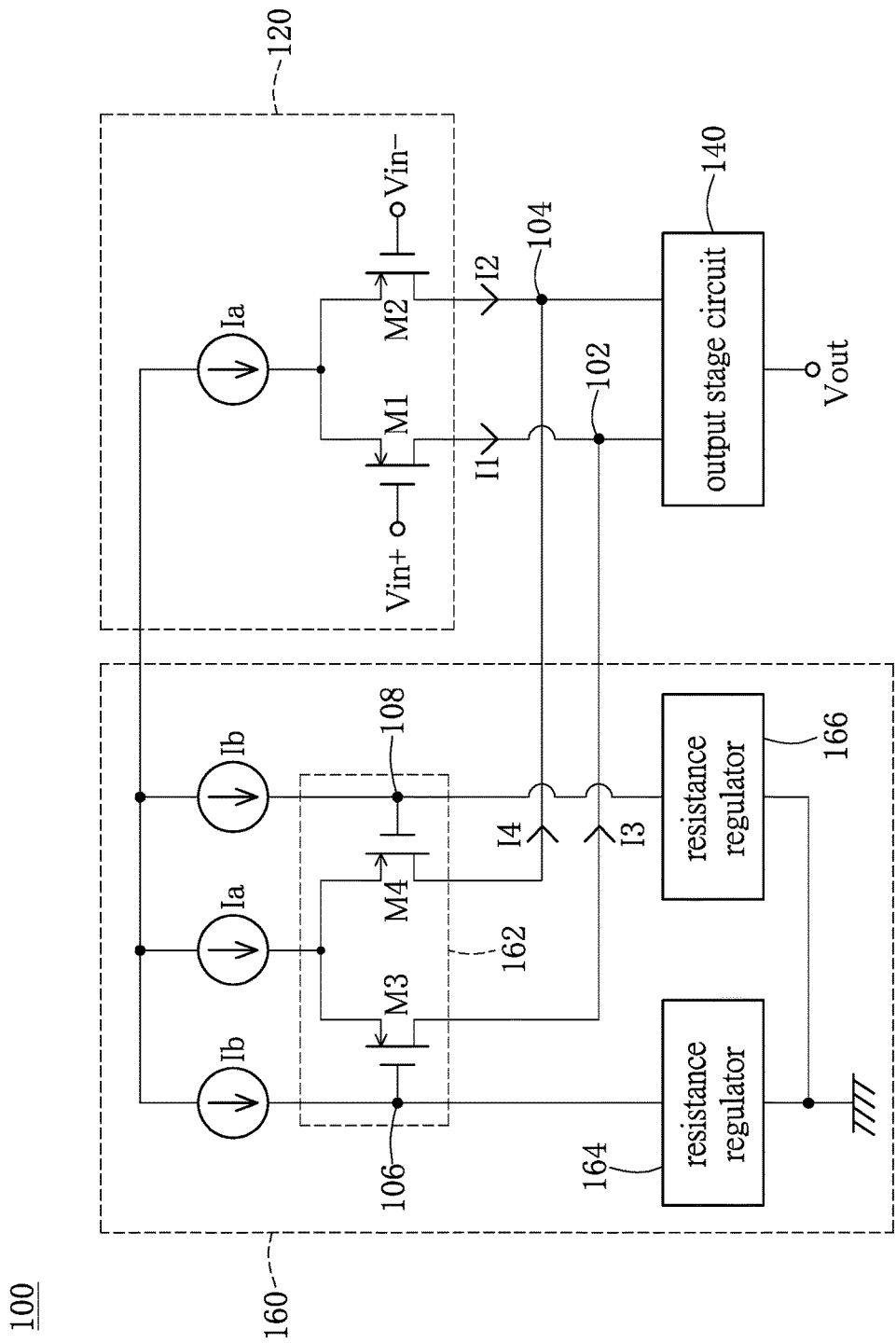
FIG. 4 shows the detail diagram of the operational amplifier of FIG. 3.

Please refer to FIG. 3, which shows the diagram of an operational amplifier according to an embodiment of the present disclosure. As shown in FIG. 3, an operational amplifier 100 includes an input stage circuit 120, an output stage circuit 140, and a current adjusting circuit 160. The input stage circuit 120 has a positive input terminal Vin+, a negative input terminal Vin−, a first terminal 102, and a second terminal 104. The input stage circuit 120 respectively outputs a first current I1 and a second current I2 to the first terminal 102 and the second terminal 104 according to a voltage received from the positive input terminal Vin+ and a voltage received from the negative input terminal Vin−. Please refer to FIG. 4 in conjunction with FIG. 3. In the present embodiment, the input stage circuit 120 includes a current source Ia, a first transistor M1, and a second transistor M2. The first transistor M1 is coupled between the current source Ia and the first terminal 102. A control terminal of the first transistor M1 is coupled to the positive input terminal Vin+. The second transistor M2 is coupled between the current source Ia and the second terminal 104. A control terminal of the second transistor M2 is coupled to the negative input terminal Vin−. Therefore, the first transistor M1 and the second transistor M2 are turned on by the voltage received from the positive input terminal Vin+ and the voltage received from the negative input terminal Vin−, to respectively output the first current I1 and the second current I2 to the first terminal 102 and the second terminal 104.

The output stage circuit 140 is coupled to the first terminal 102 and the second terminal 104. The output stage circuit 140 outputs an amplified result from the output terminal Vout according to a current received from the first terminal 102 and a current received from the second terminal 104. In addition, an offset voltage Vos represents non-ideal effects of the operational amplifier 100 (which does not exist in the actual circuit). The current adjusting circuit 160 is used for adjusting the first current I1 and the second current I2 outputted from the input stage circuit 120, to compensate the influence of the offset voltage Vos. Therefore, in the operational amplifier 100, the current adjusting circuit 160 can compensate the influence of the offset voltage Vos (such as physical properties of semiconductors, process imperfections, component mismatches, etc.) by adjusting the first current I1 and the second current I2.

More specifically, the input stage circuit 12 includes an auxiliary circuit 162 and two resistance regulators 164 and 166. The auxiliary circuit 162 is coupled to the first terminal 102 and the second terminal 104. The auxiliary circuit 162 includes a positive auxiliary terminal 106 and a negative auxiliary terminal 108. Two resistance regulators 164 and 166 are coupled to the positive auxiliary terminal 106 and the negative auxiliary terminal 108 respectively. Two resistance regulators 164 and 166 adjust the voltage of the positive auxiliary terminal 106 and the voltage of the negative auxiliary terminal 108 according to the first current I1 and the second current I2, to control the auxiliary circuit 162 transmitting a first auxiliary current I3 and a second auxiliary current I4 to the first terminal 102 and the second terminal 104 respectively.

In the present embodiment, the auxiliary circuit 162 includes a current source Ia, a first auxiliary transistor M3, and a second auxiliary transistor M4. The first auxiliary transistor M3 is coupled between the current source Ia and the first terminal 102. A control terminal of the first auxiliary transistor M3 is coupled to the positive auxiliary terminal 106. The second auxiliary transistor M4 is coupled between the current source Ia and the second terminal 104. A control terminal of the second auxiliary transistor M4 is coupled to the negative auxiliary terminal 108. Therefore, the resistance values of two resistance regulators 164 and 166 are adjusted by the first current I1 and the second current I2, to change the voltage of the positive auxiliary terminal 106 and the voltage of the negative auxiliary terminal 108. The first auxiliary transistor M3 and the second auxiliary transistor M4 are turned on by the voltage of the positive auxiliary terminal 106 and the voltage of the negative auxiliary terminal 108, to respectively output the first auxiliary current I3 and the second auxiliary current I4 to the first terminal 102 and the second terminal 104.

More specifically, the resistance regulator 164 is coupled to the auxiliary current source Ib through the positive auxiliary terminal 106. The voltage of the positive auxiliary terminal 106 is adjusted by a current value of the auxiliary current source Ib and a resistance value of the corresponding resistance regulator 164. The resistance regulator 166 is coupled to the auxiliary current source Ib through the negative auxiliary terminal 108. The voltage of the negative auxiliary terminal 108 is adjusted by a current value of the auxiliary current source Ib and a resistance value of the corresponding resistance regulator 166.

Figure 5A:
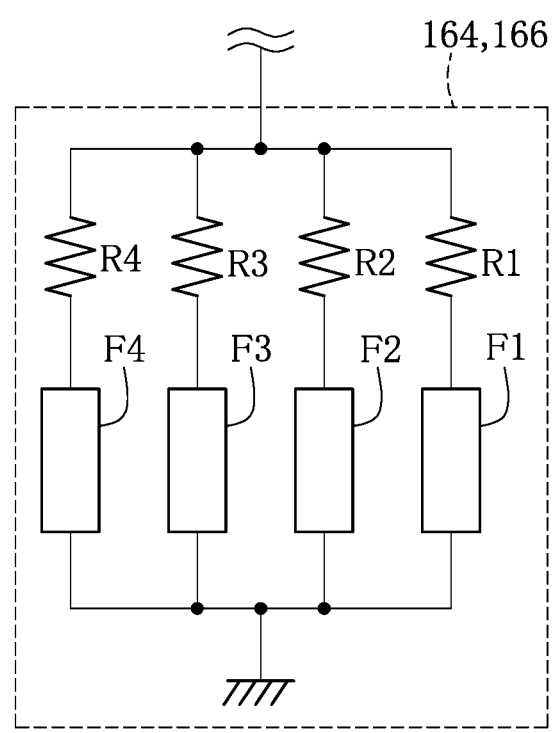
FIG. 5A shows the diagram of a resistance regulator according to an embodiment of the present disclosure.

Please refer to FIG. 5A, which shows the diagram of a resistance regulator according to an embodiment of the present disclosure. In the present embodiment, each resistance regulator 164 and 166 includes a plurality of resistors R1, R2, R3 and R4 and a plurality of switching elements F1, F2, F3 and F4. As shown in FIG. 5A, the resistors R1-R4 are connected in parallel. The switching elements F1-F4 are coupled to the resistors R1-R4 respectively. The switching elements F1-F4 are turned on or turned off according to the first current I1 and the second current I2, to adjust the resistance value of each resistance regulator 164 and 166. For example, when the user turns on the switching elements F1 and F3 and turns off the switching elements F2 and F4, the resistance regulator 164 generates the resistance value of the resistors R1 and R3 connected in parallel.

Figure 5B:
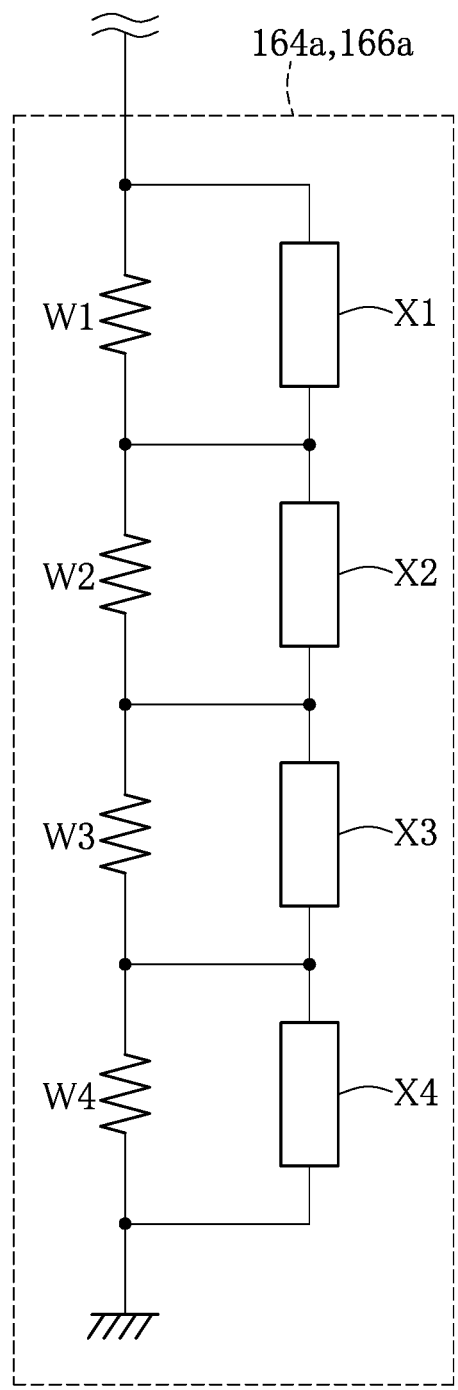
FIG. 5B shows the diagram of a resistance regulator according to another embodiment of the present disclosure.

In another embodiment, each resistance regulator 164a and 166b includes a plurality of resistors W1, W2, W3 and W4, and a plurality of switching elements X1, X2, X3 and X4. As shown in FIG. 5B, the resistors W1-W4 are connected in serial. The switching elements X1-X4 are respectively coupled to two terminals of the resistors W1-W4. The switching elements X1-X4 are connected in series and are turned on or turned off according to the first current I1 and the second current I2, to adjust the resistance value of each resistance regulator 164a and 166a. For example, when the user turns on the switching elements X1 and X3 and turns off the switching elements X2 and X4, the resistance regulator 164a generates the resistance value of the resistors W1 and W3 connected in serial.

Compared with the structure of the resistors R1-R4 connected in parallel of the previous embodiment, the resistors W1-W4 of the present embodiment are connected in serial. The structure can generate more different resistance values by the switching elements X1-X4. The switching elements F1-F4 and X1-X4 can be transistors, fuses, or other elements which can be selectively turned on or turned off The resistance regulators 164 and 166 can be implemented in other configurations. The present disclosure is not limited thereto.

When the first current I1 is higher than the second current I2, the user adjusts the resistance value of the resistance regulator 164 and the resistance value of the resistance regulator 166 (i.e., the resistance value of the resistance regulator 164 is higher than that of the resistance regulator 166), to adjust the voltage of the positive auxiliary terminal 106 and the voltage of the negative auxiliary terminal 108 (i.e., the voltage of the positive auxiliary terminal 106 is higher than the voltage of the negative auxiliary terminal 108). At this time, the first auxiliary transistor M3 and the second auxiliary transistor M4 respectively generate the first auxiliary current I3 and the second auxiliary current I4 to the first terminal 102 and the second terminal 104. The first auxiliary current I3 is smaller than the second auxiliary current I4, so that the current sum (i.e., the adjusted first current) of the first current I1 and the first auxiliary current I3 is approximately equal to the current sum (i.e., the adjusted second current) of the second current I2 and the second auxiliary current I4.

Conversely, when the first current I1 is smaller than the second current I2, the user adjusts the resistance value of the resistance regulator 164 and the resistance value of the resistance regulator 166 (i.e., the resistance value of the resistance regulator 164 is smaller than that of the resistance regulator 166), so that the voltage of the positive auxiliary terminal 106 is higher than the voltage of the negative auxiliary terminal 108. At this time, the first auxiliary transistor M3 and the second auxiliary transistor M4 respectively generate the first auxiliary current I3 and the second auxiliary current I4 to the first terminal 102 and the second terminal 104. The first auxiliary current I3 is higher than the second auxiliary current I4, so that the current sum (i.e., the adjusted first current) of the first current I1 and the first auxiliary current I3 is approximately equal to the current sum (i.e., the adjusted second current) of the second current I2 and the second auxiliary current I4.

As aforementioned, the operational amplifier 100 compensates the influence of the offset voltage Vos by the current adjusting circuit 160. In particular, the operational amplifier 100 adjusts the resistance value of the resistance regulator 164 and the resistance value of the resistance regulator 166 to control the first auxiliary current I3 and the second auxiliary current I4 generated from the auxiliary circuit 162, thereby adjusting the first current I1 and the second I2 generated from the input stage circuit 120 so as to lower the bias voltage Vos to be near 0 volt. Conventional operational amplifiers using the transistors to adjust the offset voltage would cause the higher least significant bit (LSB) distribution, so the error occurred in adjusting the offset voltage becomes higher. As the operational amplifier of the present disclosure uses the resistors to adjust the offset voltage and the matching degree of the resistance is higher than that of the transistor, the Least Significant Bit (LSB) distribution can be reduced, thereby enhancing the accuracy of the offset voltage.

Figure 6:
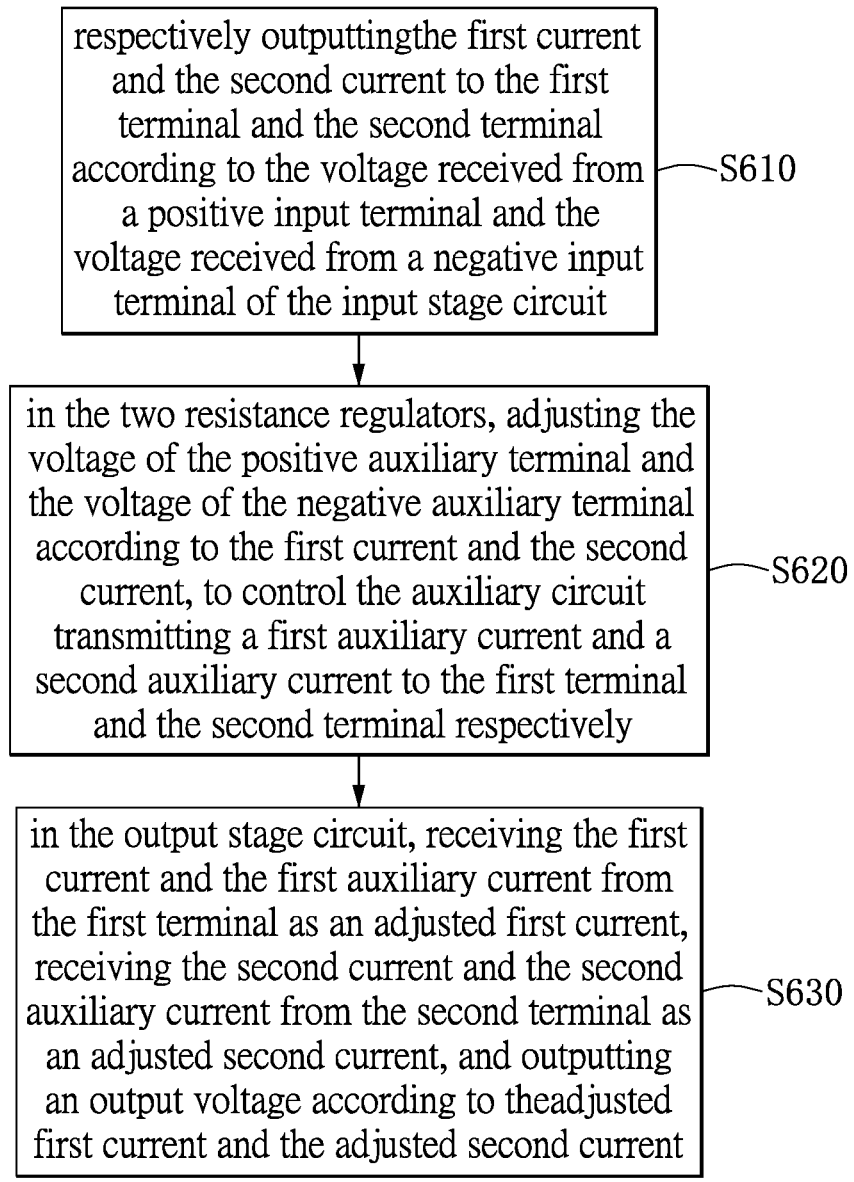
FIG. 6 shows the flowchart of a method for reducing offset voltage of the operational amplifier according to an embodiment of the present disclosure.

For the aforementioned exemplary embodiments, the present disclosure further provides a method for reducing an offset voltage of an operational amplifier, which is adapted for the operational amplifier 100. The internal components of the operational amplifier 100 have been delineated in the previous exemplary embodiments, so a detailed description is omitted. Please refer to FIG. 6 in conjunction with FIGS. 3-5. Firstly, the operational amplifier 100 respectively outputs a first current I1 and a second current I2 to the first terminal 102 and the second terminal 104 according to a voltage received from a positive input terminal Vin+ and a voltage received from a negative input terminal Vin− of the input stage circuit 120 (step S610).

Next, the two resistance regulators 164 and 166 of the operational amplifier 100 adjust a voltage of the positive auxiliary terminal 106 and a voltage of the negative auxiliary terminal 108 according to the first current I1 and the second current I2, to control the auxiliary circuit 162 transmitting a first auxiliary current I3 and a second auxiliary current I4 to the first terminal 102 and the second terminal 104 respectively (step S620). More specifically, the operational amplifier 100 adjusts the voltage of the positive auxiliary terminal 106 according to a current value of the auxiliary current source Ib and a resistance value of the corresponding resistance regulator 164. The operational amplifier 100 adjusts the voltage of the negative auxiliary terminal 108 according to a current value of the auxiliary current source Ib and a resistance value of the corresponding resistance regulator 166. The resistance value of the resistance regulator 164 and the resistance value of the resistance regulator 166 turn on or turn off the switching elements F1-F4 according to the first current I1 and the second current I2, to generate the needed resistance values. The exemplary embodiments of FIG. 5A and FIG. 5B have illustrated the resistance regulators 164 and 166 generating the different resistance values according to the first current I1 and the second current I2, so a detailed description is omitted.

Finally, the output stage circuit 140 of the operational amplifier 100 receives the first current I1 and the first auxiliary current I3 from the first terminal 102 as an adjusted first current. The output stage circuit 140 receives the second current I2 and the second auxiliary current I4 from the second terminal 104 as an adjusted second current. Then the output stage circuit 140 outputs an output voltage according to the adjusted first current and the adjusted second current (step S630).

Figure 7:
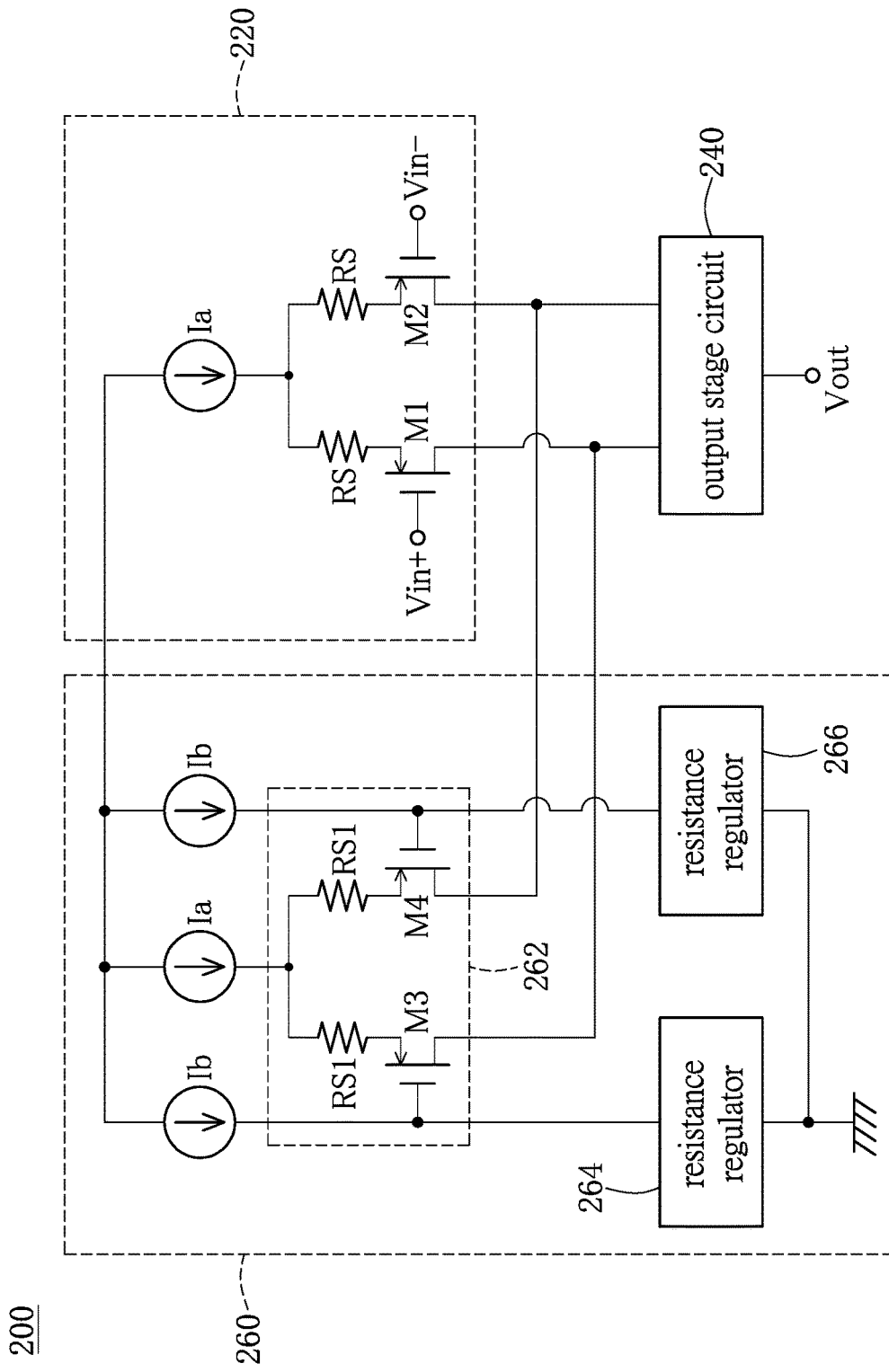
FIG. 7 shows the detail diagram of an operational amplifier according to another embodiment of the present disclosure.

Please refer to FIG. 7, which shows the detail diagram of an operational amplifier according to another embodiment of the present disclosure. The difference between the operational amplifier 100 of FIG. 4 and the operational amplifier 200 in the present embodiment is that the input stage circuit 220 further includes two resistors RS. One of the two resistors RS is coupled between the current source Ia and the first transistor M1, and the other of the two resistors RS is coupled between the current source Ia and the second transistor M2. In addition, the auxiliary circuit 262 of the current adjusting circuit 260 has also two resistors RS1, wherein one of the two resistors RS1 is coupled between the current source Ia and the first auxiliary transistor M3 and the other of the two resistors RS1 is coupled between the current source Ia and the second auxiliary transistor M4. The inner structures and operations of the resistance regulators 264, 266 and the output stage circuit 240 in the operational amplifier 200 are the same as those of the resistance regulators 164, 166 and the output stage circuit 140 in the operational amplifier 100, so a detailed description is omitted.

Accordingly, in the structure of the operational amplifier 200, the conversion gain (gm) can be linearly adjusted by the resistors RS and RS1. Preferably, the resistor RS is the same as the resistor RS1. For example, the resistors RS and RS1 have the same resistance value, and the conversion gain (gm) is linearly adjusted by the resistance value, e.g., the function, gm=1/RS. Compared with the operational amplifier 200 of the present embodiment, the operational amplifier 100 of the previous embodiment cannot linearly adjust the conversion gain (gm), but the operational amplifier 200 of the present embodiment can generate the conversion gain (gm) more accurately.

In summary, the present disclosure provides an operational amplifier and a method for reducing the offset voltage of the operational amplifier, which use resistors to adjust the offset voltage so as to reduce the Least Significant Bit (LSB) distribution, thereby enhancing the accuracy of the offset voltage.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:
1. An operational amplifier, comprising:
an input stage circuit having a positive input terminal, a negative input terminal, a first terminal, and a second terminal, and respectively outputting a first current and a second current to the first terminal and the second terminal according to a voltage received from the positive input terminal and a voltage received from the negative input terminal;
a current adjusting circuit, including:
an auxiliary circuit, coupled to the first terminal and the second terminal, and having a positive auxiliary terminal and a negative auxiliary terminal;
two resistance regulators, respectively coupled to an auxiliary current source through the positive auxiliary terminal and the negative auxiliary terminal, adjusting a voltage of the positive auxiliary terminal and a voltage of the negative auxiliary terminal according to the first current and the second current, to control the auxiliary circuit transmitting a first auxiliary current and a second auxiliary current to the first terminal and the second terminal respectively, wherein the voltage of the positive auxiliary terminal and the voltage of the negative auxiliary terminal are adjusted by a current value of the auxiliary current source and a resistance value of the corresponding resistance regulator; and
an output stage circuit, coupled to the first terminal and the second terminal, receiving the first current and the first auxiliary current from the first terminal as an adjusted first current, receiving the second current and the second auxiliary current from the second terminal as an adjusted second current, and outputting an output voltage according to the adjusted first current and the adjusted second current.

2. The operational amplifier according to claim 1, wherein the adjusted first current is equal to the adjusted second current.

3. The operational amplifier according to claim 1, wherein the input stage circuit comprises:
   a current source;
   a first transistor, coupled between the current source and the first terminal, and a control terminal of the first transistor coupled to the positive input terminal; and
   a second transistor, coupled between the current source and the second terminal, and a control terminal of the second transistor coupled to the negative input terminal.

4. The operational amplifier according to claim 3, wherein the input stage circuit further comprises two resistors, one of the two resistors is coupled between the current source and the first transistor, and the other of the two resistors is coupled between the current source and the second transistor.

5. The operational amplifier according to claim 1, wherein the auxiliary circuit further comprises:
   a current source;
   a first auxiliary transistor, coupled between the current source and the first terminal, and a control terminal of the first auxiliary transistor coupled to the positive auxiliary terminal; and
   a second auxiliary transistor, coupled between the current source and the second terminal, and a control terminal of the second auxiliary transistor coupled to the negative auxiliary terminal.

6. The operational amplifier according to claim 5, wherein the auxiliary circuit further comprises two resistors, one of the two resistors is coupled between the current source and the first auxiliary transistor, and the other of the two resistors is coupled between the current source and the second auxiliary transistor.

7. The operational amplifier according to claim 1, wherein each of the resistance regulators comprises:
   a plurality of resistors, connected in parallel; and
   a plurality of switching elements, respectively coupled to the resistors, and being turned on or turned off according to the first current and the second current, to adjust the resistance value of each resistance regulator.

8. The operational amplifier according to claim 1, wherein each of the resistance regulators comprises:
   a plurality of resistors, connected in serial; and
   a plurality of switching elements, respectively coupled to two terminals of the resistors, the switching elements being connected in series and turned on or turned off according to the first current and the second current, to adjust the resistance value of each resistance regulator.

9. A method for reducing an offset voltage of an operational amplifier, the operational amplifier having an input stage circuit, a current adjusting circuit, and an output stage circuit, the current adjusting circuit having an auxiliary circuit and two resistance regulators, the input stage circuit coupled to the output stage circuit and the auxiliary circuit by a first terminal and a second terminal, the two resistance regulators respectively coupled to an auxiliary current source by an positive auxiliary terminal and a negative auxiliary terminal of the auxiliary circuit, and the method comprising:
   respectively outputting a first current and a second current to the first terminal and the second terminal according to a voltage received from a positive input terminal and a voltage received from a negative input terminal of the input stage circuit;
   in the two resistance regulators, adjusting a voltage of the positive auxiliary terminal and a voltage of the negative auxiliary terminal according to the first current and the second current, to control the auxiliary circuit transmitting a first auxiliary current and a second auxiliary current to the first terminal and the second terminal respectively, wherein the voltage of the positive auxiliary terminal and the voltage of the negative auxiliary terminal are adjusted by a current value of the auxiliary current source and a resistance value of the corresponding resistance regulator; and
   in the output stage circuit, receiving the first current and the first auxiliary current from the first terminal as an adjusted first current, receiving the second current and the second auxiliary current from the second terminal as an adjusted second current, and outputting an output voltage according to the adjusted first current and the adjusted second current.

10. The method for reducing the offset voltage of the operational amplifier according to claim 9, wherein each of the resistance regulators comprises a plurality of resistors and a plurality of switching elements, the switching elements are coupled to the resistors respectively, and in the step of adjusting the voltage of the positive auxiliary terminal and the voltage of the negative auxiliary terminal, further comprises:
   turning on or turning off the switching elements according to the first current and the second current, to adjust the resistance value of each resistance regulator.

* * * * *